US009585278B2

(12) United States Patent
Dobler et al.

(10) Patent No.: US 9,585,278 B2
(45) Date of Patent: Feb. 28, 2017

(54) TERMINAL ASSEMBLY MODULE FOR CONNECTING AN INDUSTRIAL CONTROLLER TO PRE-EXISTING I/O WIRING

(71) Applicant: W Interconnections, Inc., Richmond, VA (US)

(72) Inventors: Phillip Dobler, Mechanicsville, VA (US); Larry Lance Lewis, Petrolia (CA); Michael John Lonergan, Mechanicsville, VA (US); Philip S. Hartman, Chester, VA (US); James E. Cahaly, West Newbury, MA (US)

(73) Assignee: W INTERCONNECTIONS, INC., Richmond, VA (US)

( * ) Notice: Subject to any disclaimer, the term of this patent is extended or adjusted under 35 U.S.C. 154(b) by 115 days.

(21) Appl. No.: 14/566,051

(22) Filed: Dec. 10, 2014

(65) Prior Publication Data

US 2016/0174406 A1  Jun. 16, 2016

(51) Int. Cl.
*H05K 7/06* (2006.01)
*H05K 3/30* (2006.01)
*H05K 13/00* (2006.01)
*H05K 7/14* (2006.01)
*G05B 19/05* (2006.01)

(52) U.S. Cl.
CPC ............ *H05K 7/06* (2013.01); *G05B 19/054* (2013.01); *H05K 3/301* (2013.01); *H05K 7/1461* (2013.01); *H05K 13/0023* (2013.01); *G05B 2219/15073* (2013.01); *G05B 2219/15078* (2013.01); *G05B 2219/21116* (2013.01)

(58) Field of Classification Search
CPC ...... H05K 7/06; H05K 3/301; H05K 13/0023; H05K 7/1461; G05B 19/054
USPC .................................. 361/748, 752
See application file for complete search history.

(56) References Cited

U.S. PATENT DOCUMENTS

| 5,515,515 A | * | 5/1996 | Kennedy | G06F 13/4081 |
| | | | | 361/679.02 |
| 5,801,921 A | * | 9/1998 | Miller | G06F 1/183 |
| | | | | 174/72 A |
| 5,903,698 A | * | 5/1999 | Poremba | G01M 11/30 |
| | | | | 385/135 |
| 6,483,709 B1 | * | 11/2002 | Layton | H05K 7/1454 |
| | | | | 361/679.4 |

(Continued)

*Primary Examiner* — Adrian S Wilson
(74) *Attorney, Agent, or Firm* — Amin, Turocy & Watson, LLP

(57) ABSTRACT

A terminal assembly module is provided that simplifies the transfer of I/O wiring from a pre-existing industrial controller to a replacement industrial controller. The terminal assembly module replaces an I/O module in the pre-existing industrial controller chassis. The I/O module terminal block, with I/O wiring maintained intact, is removed from the discarded I/O module and installed on the terminal assembly module. A multi-conductor cable is then plugged into a cable connector on the front of the terminal assembly module, which electrically connects the I/O module terminals to the conductors of the cable. The cable conductors can then be connected to the I/O modules of the new industrial controller. Thus, the terminal assembly module eliminates the need to disconnect the existing I/O wiring from the I/O module terminal blocks of the pre-existing industrial controller.

12 Claims, 16 Drawing Sheets

(56) References Cited

U.S. PATENT DOCUMENTS

| | | | | |
|---|---|---|---|---|
| 6,663,434 B1* | 12/2003 | Wu | ............... | H01R 13/26 |
| | | | | 439/350 |
| 7,351,110 B1* | 4/2008 | Wu | ............... | G06F 3/023 |
| | | | | 439/638 |
| 7,813,113 B2* | 10/2010 | Chuang | ............ | G06F 13/409 |
| | | | | 361/679.01 |
| 2002/0171999 A1* | 11/2002 | Huang | ............ | G06K 7/0013 |
| | | | | 361/600 |
| 2003/0032333 A1* | 2/2003 | Kwong | ............ | G06F 3/0607 |
| | | | | 439/638 |
| 2003/0112595 A1* | 6/2003 | Kwong | ............ | G11B 33/122 |
| | | | | 361/679.33 |
| 2004/0023522 A1* | 2/2004 | Chang | .............. | H01R 29/00 |
| | | | | 439/43 |
| 2004/0097122 A1* | 5/2004 | Garrett | ............ | H01R 13/518 |
| | | | | 439/378 |
| 2006/0046575 A1* | 3/2006 | Allen | ............. | H01R 33/97 |
| | | | | 439/638 |
| 2006/0050477 A1* | 3/2006 | Wu | ............... | G06F 1/1632 |
| | | | | 361/679.32 |
| 2008/0037211 A1* | 2/2008 | Martin | ............ | G11B 25/043 |
| | | | | 361/679.37 |
| 2008/0253076 A1* | 10/2008 | Chen | .............. | G06F 1/186 |
| | | | | 361/679.31 |
| 2010/0227493 A1* | 9/2010 | Guy | .............. | H01R 13/2421 |
| | | | | 439/345 |
| 2011/0294309 A1* | 12/2011 | Chen | .............. | H04L 49/45 |
| | | | | 439/65 |
| 2013/0163179 A1* | 6/2013 | Ma | ................ | G06F 1/183 |
| | | | | 361/679.33 |

* cited by examiner

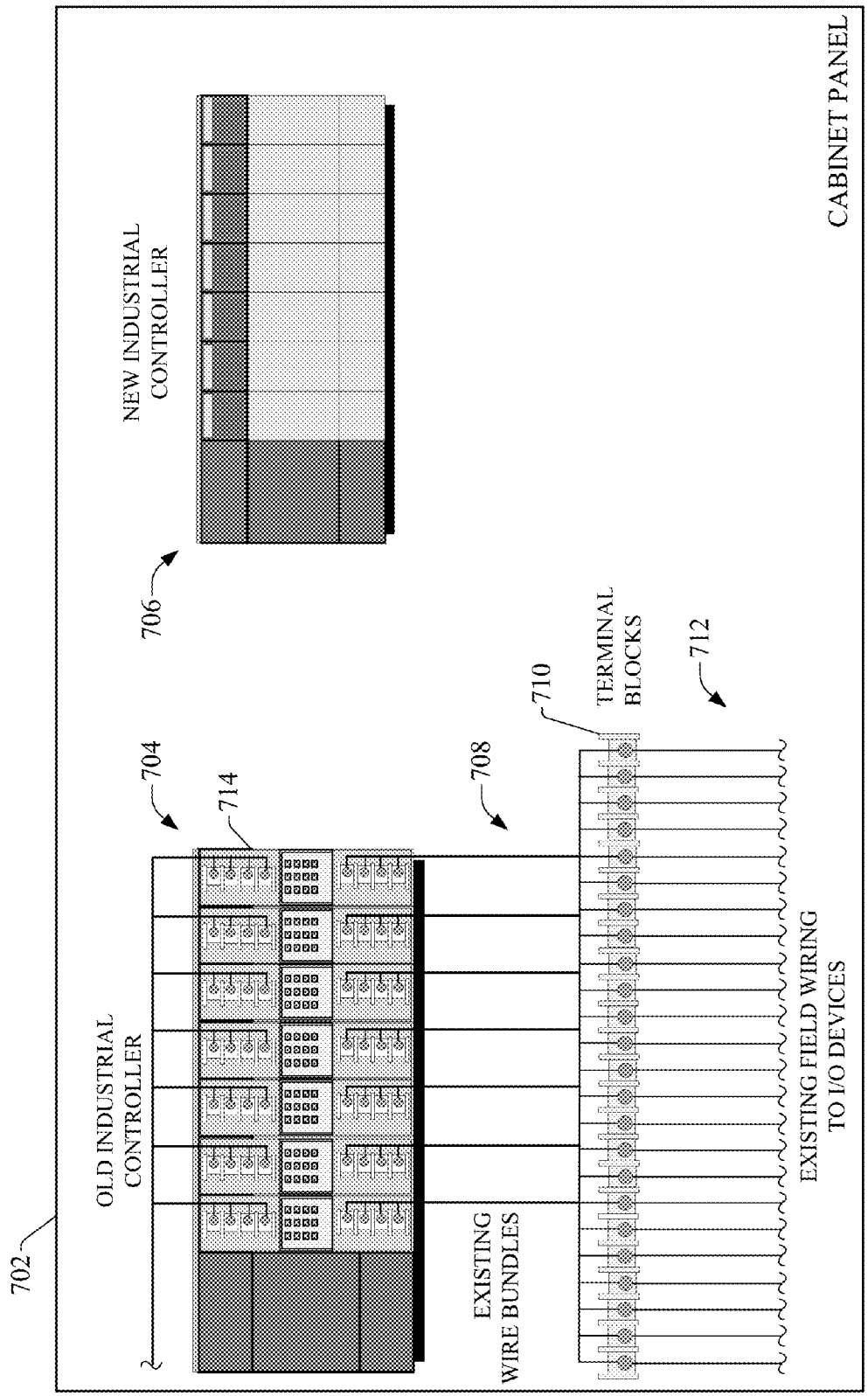

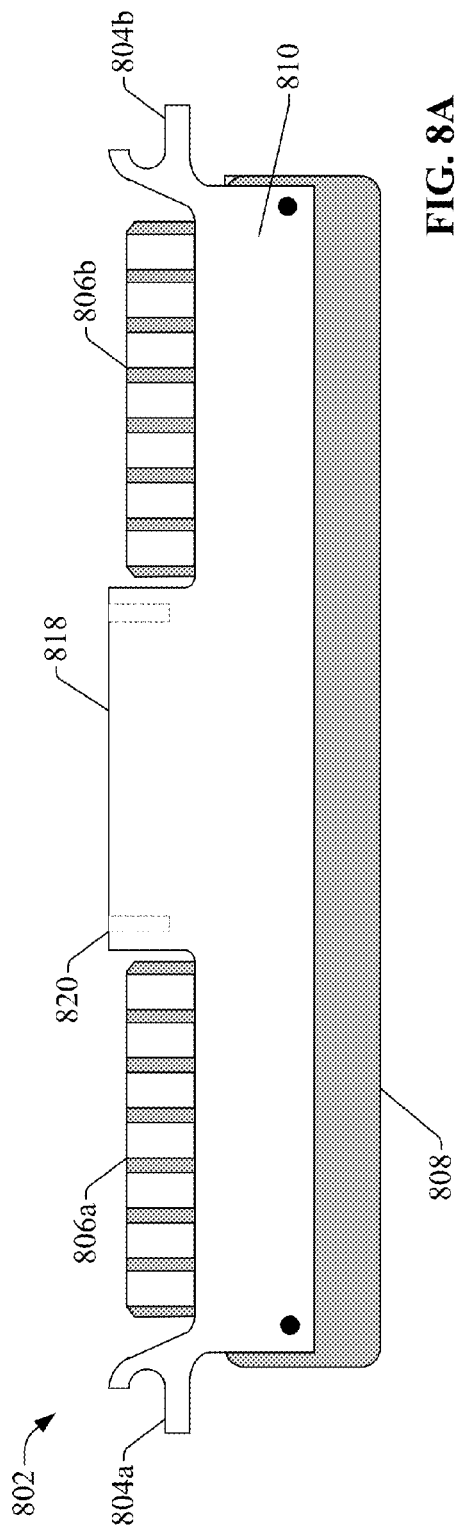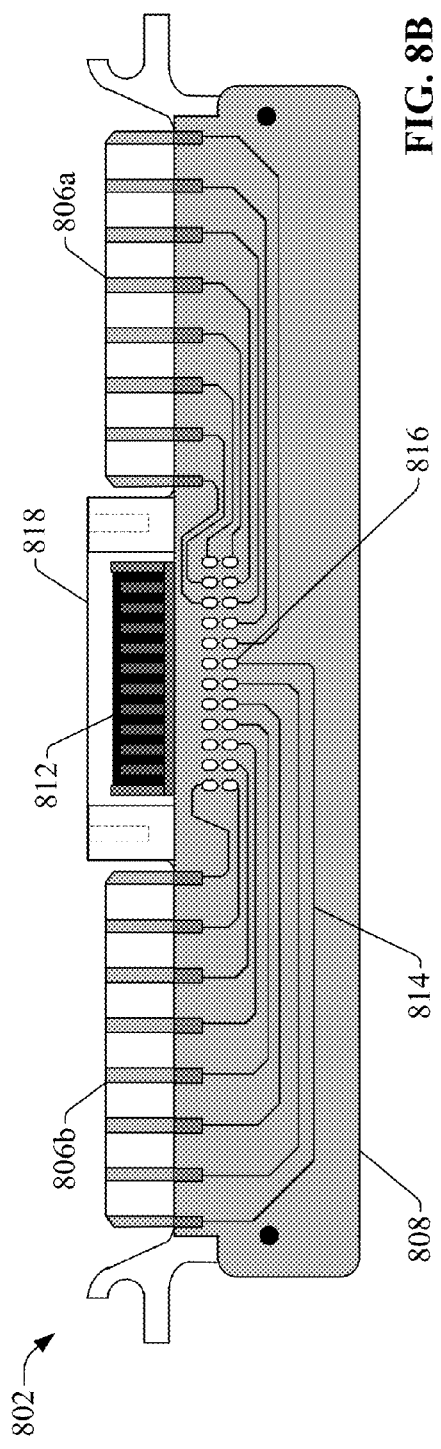

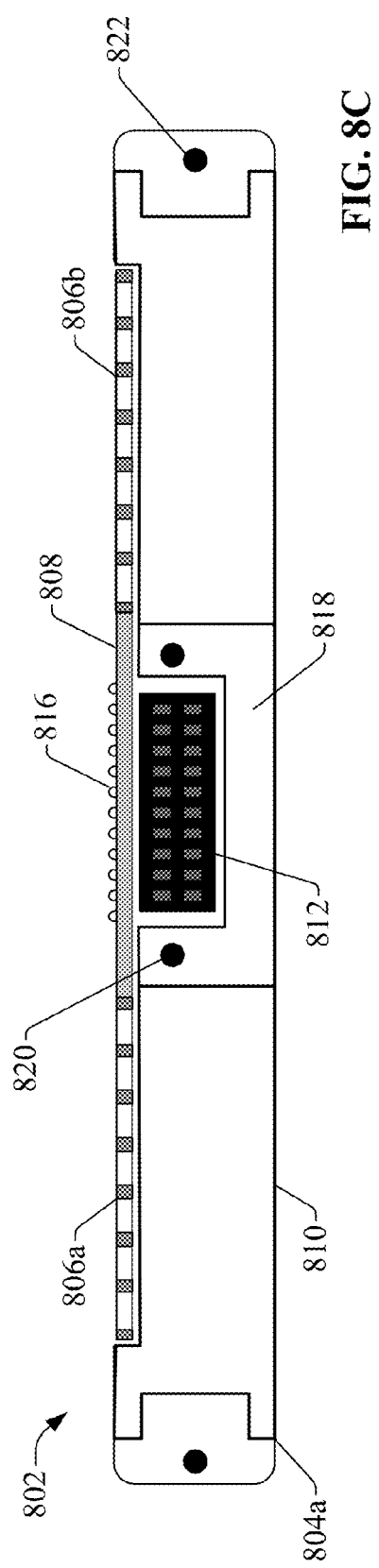

US 9,585,278 B2

TERMINAL ASSEMBLY MODULE FOR CONNECTING AN INDUSTRIAL CONTROLLER TO PRE-EXISTING I/O WIRING

BACKGROUND

The subject matter disclosed herein relates generally to installation of industrial controllers, and, more particularly, to a terminal assembly module that electrically connects I/O modules of a replacement industrial controller to pre-existing I/O wiring without the need to disconnect the I/O wiring from the obsolete I/O module terminals.

BRIEF DESCRIPTION

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

In one or more embodiments, a terminal assembly module is provided, comprising a carrier configured to mount over a slot of an industrial controller chassis; and a circuit board mounted to the carrier, wherein the circuit board comprises at least one edge connector having conductive strips that are electrically connected, via conductive traces on the printed circuit board, to respective pins of a cable connector mounted to the circuit board, and wherein the carrier is configured to orient the at least one edge connector and the cable connector to face outward through the front of the industrial controller chassis and to align the at least one edge connector to interface with at least one I/O terminal block of an I/O module while the carrier is mounted over the slot.

Also, one or more embodiments provide a method for manufacturing a terminal assembly module for electrically connecting I/O device wiring to an industrial controller, comprising fabricating a circuit board comprising at least one edge connector with conductive strips; mounting a cable connector to the circuit board; electrically connecting the conductive strips of the at least one edge connector to respective pins of the cable connector via conductive traces on the circuit board; and mounting the circuit board to a carrier configured to mount over a slot of an industrial controller chassis, wherein the mounting comprises mounting the circuit board such that, when the carrier is mounted over the slot, the at least one edge connector and the cable connector face outward through the front of the industrial controller chassis and the at least one edge connector is positioned to connect to at least one I/O terminal block of an I/O module.

Also, according to one or more embodiments, system for electrically connecting an I/O module of an industrial controller to I/O device wiring is provided, comprising a circuit board comprising at least one edge connector and a cable connector, wherein the at least one edge connector comprises conductive strips that are electrically connected to respective pins of the cable connector via conductive traces on the circuit board; and a carrier configured to mount over a slot of an industrial controller chassis and to hold the circuit board with the at least one edge connector and the cable connector facing outward through the front of the industrial controller chassis while the carrier is mounted over the slot, wherein the carrier is configured to position the at least one edge connector within the slot to allow the at least one edge connector to connect to at least one I/O terminal block of an I/O module.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIG. 7 is a diagram of an example panel layout including an old industrial controller to be replaced with a more recently installed new industrial controller.

FIG. 8A-8C are front, rear, and top views, respectively, of an example terminal assembly module designed for compatibility with the industrial controller illustrated in FIGS. 4-6.

DETAILED DESCRIPTION

Figure 1:
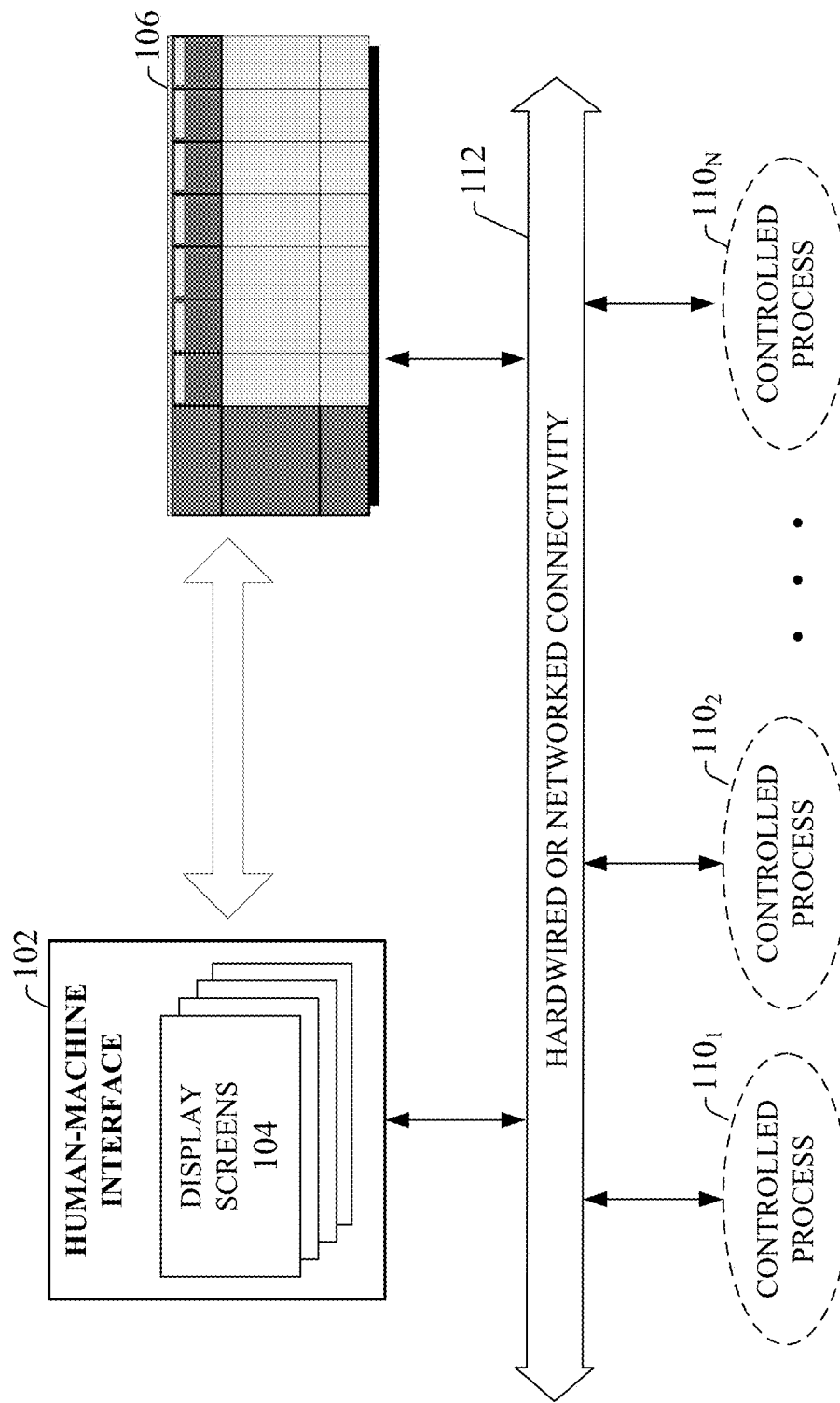
FIG. 1 is a diagram of a generalized control environment comprising a number of controlled processes under control of an industrial controller.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removable affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

Industrial controllers and their associated I/O devices are central to the operation of modern automation systems. These controllers interact with field devices on the plant floor to control automated processes relating to such objectives as product manufacture, material handling, batch processing, supervisory control, and other such applications. Industrial controllers store and execute user-defined control programs to effect decision-making in connection with the controlled process. Such programs can include, but are not limited to, ladder logic, sequential function charts, function block diagrams, structured text, or other such platforms.

FIG. 1 is a block diagram of a generalized control environment comprising a number of controlled processes under control of an industrial controller. An industrial facility can comprise one or more controlled processes $110_1$-$110_N$ relating to product manufacture, machining, motion control, batch processing, material handling, or other such industrial functions. Controlled processes $110_1$-$110_N$ can be monitored and controlled by at least one controller 106. Controller 106 can comprise an industrial controller, such as a programmable logic controller (PLC) or other such programmable automation controller (PAC), that executes a control program to facilitate monitoring and control of controlled processes $110_1$-$110_N$. The control program executed by industrial controller 106 can comprise any conceivable type of code used to process input signals read into the controller 106 and to control output signals from the controller, including but not limited to ladder logic, sequential function charts, function block diagrams, or structured text. Data read into or generated by controller 106 can be stored in a data table within controller memory, which can comprise native memory or removable storage media.

Controller 106 may communicatively interface with controlled processes $110_1$-$110_N$ over hardwired or networked connections 112. For example, controller 106 can be equipped with native hardwired inputs and outputs that communicate with one or more field devices associated with the controlled processes $110_1$-$110_N$ to effect control of the devices. The native controller I/O can include digital I/O that transmits and receives discrete voltage signals to and from the field devices, or analog I/O that transmits and receives analog voltage or current signals to and from the devices. The controller I/O can communicate with the controller's processor over a backplane such that the digital and analog signals can be read into and controlled by the control programs. Controller 106 can also communicate with field devices over a network using, for example, a communication module or an integrated networking port. Exemplary networks can include the Internet, intranets, Ethernet, DeviceNet, ControlNet, Data Highway and Data Highway Plus (DH/DH+), Remote I/O, Fieldbus, Modbus, Profibus, wireless networks, serial protocols, and the like.

The example system may also includes at least one human-machine interface 102 (e.g., a human-machine interface, or HMI) communicatively coupled with controller 106 (e.g., via a network connection) to visualize the controlled processes. HMI 102 can exchange data with controller 106 to facilitate visualization of information relating to controlled processes $110_1$-$110_N$ and to allow an operator to submit data to controller 106 in the form of issued commands (e.g., cycle start commands, device actuation commands, etc.), setpoint values, and the like. HMI 102 can generate one or more display screens 104 through which the operator interacts with the controller 106, and thereby with the controlled processes $110_1$-$110_N$. Example display screens can visualize present states of the controlled processes $110_1$-$110_N$ using graphical representations of the processes that display metered or calculated values, employ color or position animations based on state, render alarm notifications, or employ other such techniques for presenting relevant data to the operator. Data presented in this manner is read from controller 106 by HMI 102 and presented on one or more of the display screens 104 according to display formats chosen by the system developer.

Figure 2:
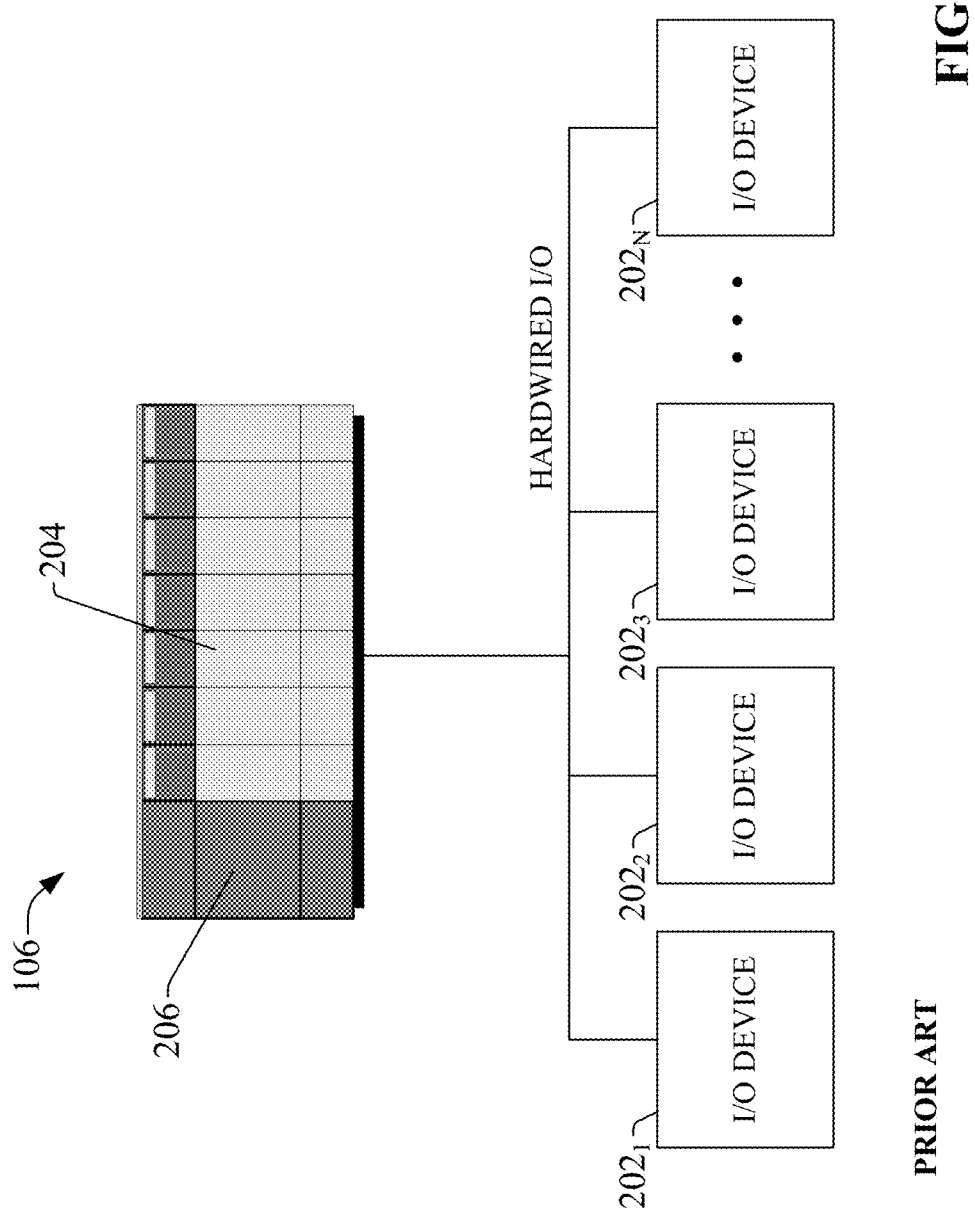
FIG. 2 is a diagram illustrating one or more I/O devices electrically interfaced to an industrial controller via the controller's I/O module.

Controlled processes 110 typically comprise one or more I/O devices that are electrically connected to the industrial controller 106 via the controller's I/O modules, as illustrated in FIG. 2. These I/O devices 202 may comprise digital input devices (e.g., push buttons, selector switches, safety devices, proximity switches, photo sensors, etc), digital output devices (e.g., solenoid values, indicator lights, motor contactors, etc.), analog input devices (e.g., 4-20 mA telemetry devices or other analog measurement devices), or analog output devices (e.g., variable frequency drives, flow control valves, speed control devices, etc.). Typically, each I/O device 202 is wired to a terminal of an appropriate I/O module 204 of industrial controller 106. I/O modules are generally classified as digital input, digital output, analog input, or analog output modules to accommodate the different types of I/O devices 202. In order to suit the needs of each particular control application, industrial controllers typically comprise a multi-slot chassis that allows a selected type of I/O module to be installed in each slot of the chassis. One slot of the chassis is typically dedicated to the controller's processor module 206, although some designs allow the processor module 206 to be inserted into any slot of the module.

Figure 3:
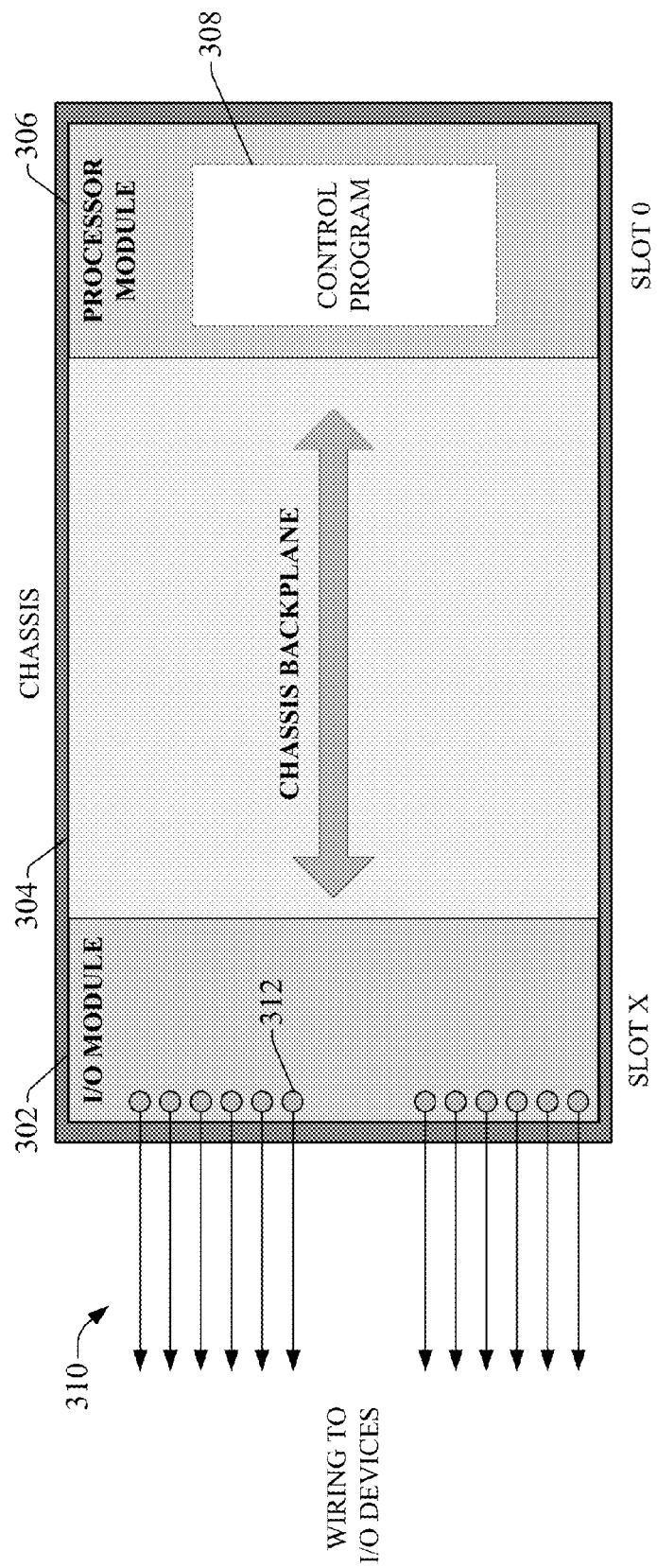
FIG. 3 is a diagram illustrating communication between a controller module and an I/O module within an industrial controller chassis.

FIG. 3 is a diagram illustrating communication between a processor module 306 and an I/O module 302 within an industrial controller chassis 304. Each terminal 312 of I/O module 302 is wired to an I/O device via field wiring 310, allowing electrical signals to be exchanged between the I/O device and I/O module 302. If the I/O module 302 is an input module, each input I/O device provides a discrete (e.g., 24 VDC) or analog (e.g., 4-20 mA) electrical signal to the I/O module 302 via field wiring 310 for processing by processor module 306. If the I/O module 302 is an output module, the I/O module 302 sends discrete or analog output signals to the I/O devices via field wiring 310 in accordance with commands issued by the processor module 306. Processor module 306 executes a user-defined control program 308 (e.g., a ladder logic program, a sequential function block program, etc.) that controls the output signals sent to the output field devices via the output modules as a function of the received input signals and user defined control sequences. The I/O module 302 exchanges information with processor module 306 via a communication backplane located at the back of the chassis 304. Typically, when an I/O module or processor module is inserted into a slot of the chassis 304, an interface connector on the rear side of the module plugs into the chassis backplane, thereby allowing data exchange between the processor module and I/O module.

In order to maintain performance integrity and safety, it eventually becomes necessary to replaced older legacy controllers with new or upgraded controllers. Replacement of older industrial controllers may be driven, for example, by the availability of newer controllers offering enhanced performance, smaller sizes, and more intuitive user interface capabilities. Plant engineers may also choose to replace older controllers as those controllers approach the end of their practical life span in order to mitigate the risks associated with controller failure. Transitioning from an existing controller to a new controller is a complicated undertaking since—in addition to accurately converting the existing control program to a format compatible with the new controller's programming platform—the existing I/O wiring must be disconnected from the older I/O modules and reconnected to the I/O modules of the new controller.

One technique for replacing an older controller with a new controller involves disconnecting the existing I/O wiring from the old controller, removing the old chassis (including the old I/O and processor modules) from the panel inside the control cabinet, and installing the new chassis, processor module, and I/O modules on the panel. It then becomes necessary to re-connect the existing I/O wiring on the terminals of the new I/O modules. However, the size of the new chassis may be considerably different than that the old chassis (typically, a newer controller will have a smaller chassis than older controllers due to size reduction of newer components). Since the existing I/O wiring was previously cut to size based on the size and shape of the original controller and the locations of the original I/O module terminals, this replacement technique often requires the existing I/O wiring to be unbundled, re-cut, re-labeled, and re-crimped with new connectors before being connected to the terminals of the new I/O modules. In some cases, the some of the existing I/O wires may be too short to reach the locations of their corresponding new I/O module terminals, requiring the complete replacement of some existing wires with newly routed wiring between the I/O module and the appropriate terminal strip on the panel.

To address these and other issues, one or more embodiments of this disclosure provide a terminal assembly module that allows the existing I/O wiring to remain connected to the I/O terminals of an original controller chassis, while routing the signals carried on this existing I/O wiring to a new cable harness that can be routed to the replacement controller within the control cabinet. This terminal assembly module allows the original controller chassis to remain mounted on the panel inside the control cabinet with the original I/O wiring maintained. The new controller can then be installed elsewhere on the panel—or in another cabinet entirely—and the new cable harness can be routed from the old controller chassis to the new controller. This technique mitigates the need to modify the existing I/O module wiring in order to accommodate the new controller size and shape.

FIGS. 4A and 4B are side and front views, respectively, of an example industrial controller 402 to be replaced with a new controller. Example industrial controller 402 comprises a chassis 404, a processor module 420, and an I/O module 424. For clarity, only a single I/O module 424 is illustrated in FIGS. 4A and 4B. In this example, processor module 420 resides in the right-most slot of the chassis 404, while I/O module 424 resides in the fourth slot to the left of processor module 420. The I/O module 424 may comprise, for example, a printed circuit board containing the components for carrying out the module's functions (e.g., circuitry for communicating with the processor module 420, circuitry for conditioning input signals from the terminals 410 for transfer over the backplane, circuitry for generating terminal output signals in accordance with commands from processor module 420, etc.). Some I/O modules may also comprise a housing that fully or partially encloses the circuit board. Grooved guide rails 406a and 406b are located at the top and bottom of chassis 404 for each slot, and are designed to guide the I/O module 424 into the slot and align the backplane edge connector 418 of the I/O module 424 with backplane interface port 416a at the rear of chassis 404 (the front view of FIG. 4B shows three unused backplane interface ports 416b). When the backplane edge connector 418 is connected to the backplane interface port 416a, the I/O module 424 and processor module 420 are able to exchange information over the backplane (as described above in connection with FIG. 3).

Figure 5:
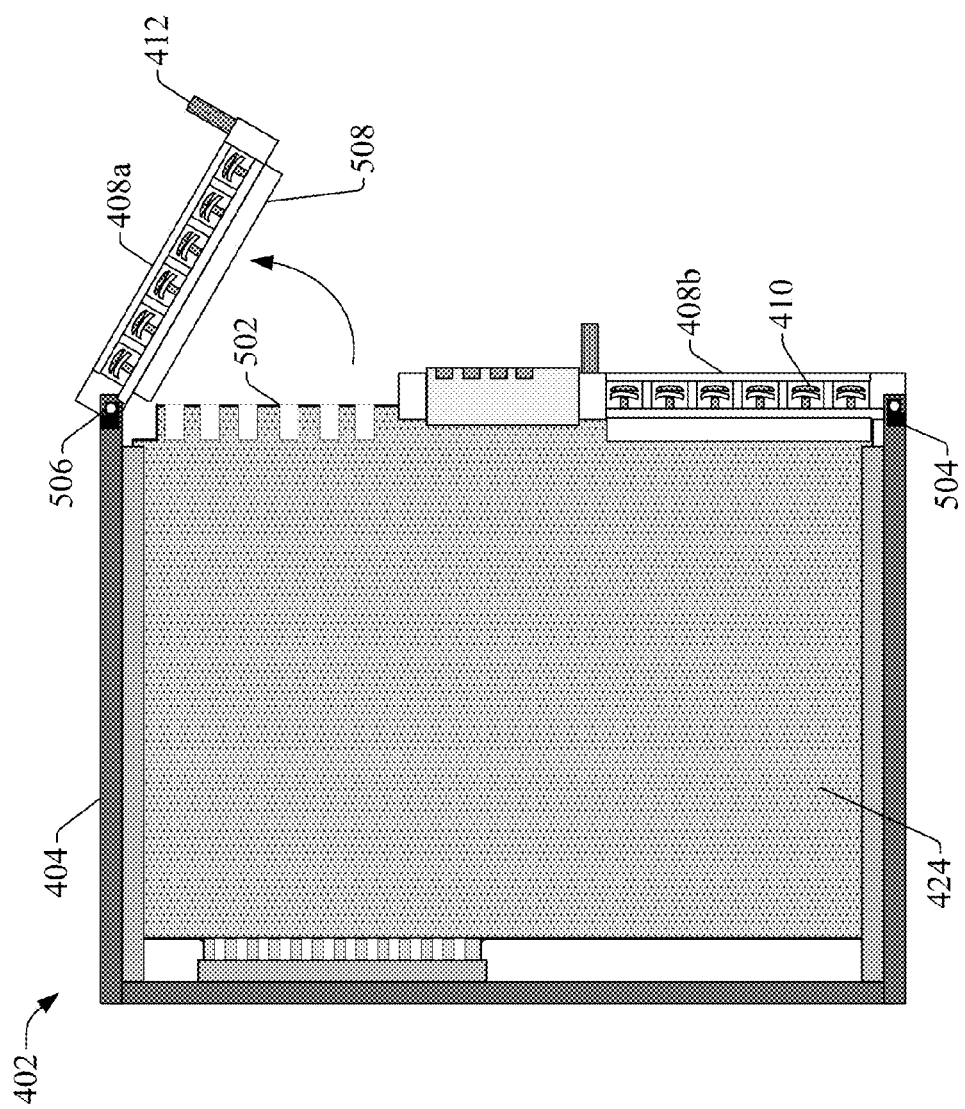
FIG. 5 is a side view of an industrial controller with the top terminal block swing arm partially swung away from I/O module.

I/O module 424 includes a front indicator panel 414 that includes status indicators—e.g., color-coded light emitting diodes (LEDs)—for conveying status information for each of the I/O points of the module, and/or general module status information. In this example, the terminals of I/O module 424 are disposed on two swing arms 408a and 408b that are hinged on the top and bottom, respectively, of chassis 404. FIG. 5 is a side view of controller 402 with the top swing arm 408a partially swung away from I/O module. Swing arms 408a and 408b each include two dowels 506 located on either side of the swing arm that are designed to slot into respective grooves 504 associated with each I/O module slot. In this way, each of the swing arms 408a and 408b are hinged about the dowels, allowing the arms (and their associated terminals 410) to be swung away from the I/O module 424 as depicted in FIG. 5. The I/O module 424 includes two edge connectors 502 on the front edge of the module's circuit board (only the top edge connector 502 is visible in FIG. 5). When the I/O module 424 is inserted into the slot, the edge connectors 502 are aligned such that, when a swing arm 408 is swung into the home position, an elongated interface receptacle 508 on the rear side of the swing arms 408 electrically interfaces with edge connectors 502, thereby electrically connecting the terminals 410 on the swing arms 408 with the I/O module's circuit board. A screw 412 on the non-hinged end of the swing arm 408a is used to lock the swing arm in place while in the home position.

Figure 6:
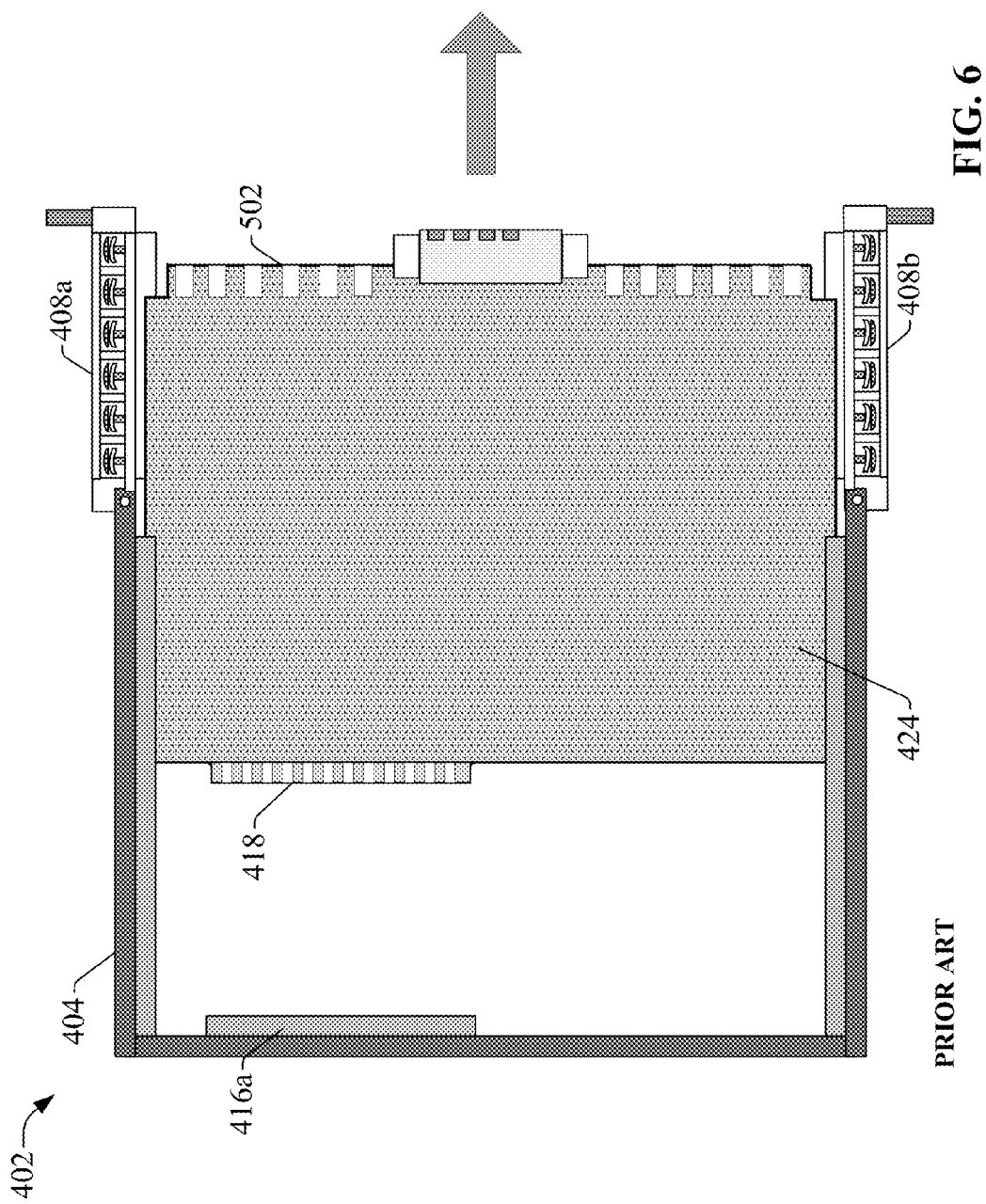
FIG. 6 is a side view of an industrial controller illustrating removal of an I/O module.

FIG. 6 is a side view of controller 402 illustrating removal of the I/O module 424. As shown, when both swing arms 408 are swung away from the chassis 404, I/O module 424 can be removed through the front of the chassis. When removed, the module's backplane edge connector 418 is disconnected from the backplane interface port 416a at the back of the chassis 404.

Although the terminal assembly module to be disclosed herein is described in connection with the chassis and I/O module design illustrated in FIGS. 4-6, it is to be appreciated that one or more embodiments of the terminal assembly module can be used with other chassis and I/O module types and configurations, and that the features of the terminal assembly module described herein are not limited to use with the particular type of chassis and I/O modules illustrated in FIGS. 4-6.

FIG. 7 is a diagram of an example panel layout including an old industrial controller 704, which is to be replaced with a more recently installed new industrial controller 706. In this example scenario, the new industrial controller 706 has been installed on the panel 702 in an available space near the old industrial controller 704, but the existing I/O module wiring is still connected to the old industrial controller 704. Field wiring 712 from the input and output devices in the field (not shown) are terminated on terminal blocks 710. A wire is run from each terminal of the terminal blocks 710 to its corresponding I/O module terminal on one of the I/O modules 714. In some installations, all the wires for a given I/O module may be bundled together (e.g., with tie wrap) to yield a set of wire bundles 708, where the individual wires of each bundle are broken out at the I/O module and landed on their respective terminals.

In order to place the automation systems or controlled processes in the field under the control of new industrial controller 706, the existing field wiring 712 must be connected to the new controller, either by disconnecting the wire bundles 708 from the old industrial controller 704 and routing them to the appropriate I/O modules of new industrial controller 706, or by running new wires from terminal blocks 710 to the new industrial controller 706. If the existing wire bundles 708 are used, it is likely that some or all of the wires will not be of suitable length for their new termination location. That is, some wires may be too short to reach their new I/O module terminal, while others will be too long, resulting in excessive wire slack that may require the wires to be cut to length, re-labeled, and re-crimped with new end connectors.

Alternatively, if new wires are run from the terminal blocks to the new industrial controller 706, the installer must disconnect and remove the old wire bundles 708 from both the old I/O modules and terminal blocks 710, label and crimp both ends of the new wires, and terminate the new wires on the terminal blocks 710 as well as on the new I/O modules.

In order to simplify the I/O wiring to the new industrial controller 706 and eliminate the need to remove the existing wire bundles 708 from the old industrial controller 704, a terminal assembly module is provided that can be installed in the old controller chassis as a replacement for an existing I/O module. The terminal assembly module electrically connects the existing I/O module terminals—and their associated wires of the existing wire bundles 708—to conductors of a new cable that can be routed to the new industrial controller 706. FIGS. 8A—8C are front, rear, and top views, respectively, of an example terminal assembly module 802 designed for compatibility with the industrial controller illustrated in FIGS. 4-6. The terminal assembly module 802 comprises a printed circuit board 808 mounted to a carrier 810 (which may be composed of plastic or another suitable non-conductive material). The circuit board 808 includes two edge connectors 806a and 806b of similar design to the edge connectors 502 of I/O module 424. That is, edge connectors 806a and 806b are configured to mate with the terminal swing arms 408a and 408b that interface with the I/O module 424.

Conductive strips on the edge connectors 806 are connected to traces 814 (e.g., copper traces) that electrically connect each conductive strip to a conductive pad 816 on the circuit board 808. Each conductive pad 816 is electrically connected to a pin of a male cable connector 812 located in a cable receptacle area 818 of carrier 810 located between the two edge connectors 806a and 806b. Thus, when a corresponding female cable connector of a multi-conductor cable is plugged into the male cable connector 812, the conductive strips of edge connectors 806a and 806b are electrically connected to respective conductors of the cable (in some embodiments, the cable connector installed on the terminal assembly module may be female, while the connector attached to the cable may be male). The cable receptacle area 818 is located on a lateral location of carrier 810 generally corresponding to the location of front indicator panel 414 of I/O module 424. Two screw holes 820 and are located on respective two sides of cable receptacle area 818 and are configured to receive the screws 412 of the swing arms 408 to facilitate locking the swing arms in place.

Carrier 810 includes two hinge portions 804a and 804b configured to receive the dowels 506 of the swing arms 408a and 408b. These hinge portions assist in aligning the swing arms with the edge connectors 806, such that the interface receptacles 508 on the rear side of the swing arms electrically connect to the edge connectors 806.

Figure 9:
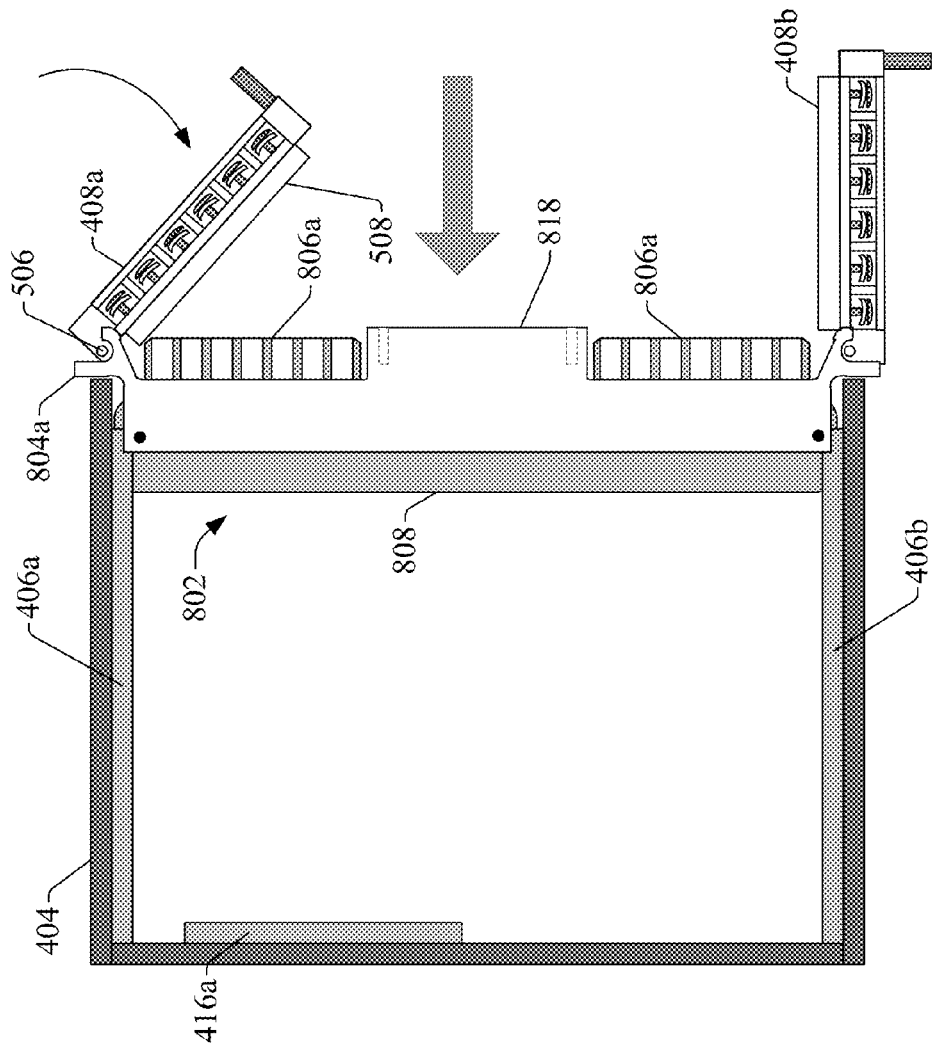
FIG. 9 is a diagram illustrating replacement of an I/O module with a terminal assembly module in an industrial controller chassis.

Terminal assembly module 802 is configured to replace an I/O module in the existing chassis of old industrial controller 704. Accordingly, screw holes 822 located on both ends of the carrier allow the terminal assembly module to be attached to the chassis. FIG. 9 is a diagram illustrating replacement of I/O module 424 (see FIGS. 4-6) with terminal assembly module 802 in chassis 404. In this example, the obsolete I/O module 424 has been removed from chassis 404 (as illustrated in FIG. 6), and terminal assembly module 802 has been inserted into the vacant slot. The width of circuit board 808 is substantially equal to the width of the I/O module's circuit board. Thus, the terminal assembly module 802 can be installed by inserting the edges of circuit board 808 into the grooved guide rails 406a and 406b of chassis 404, in a similar fashion to the I/O module. The terminal assembly module 802 is considerably shorter than the I/O module and therefore does not extend to the back of chassis 404. The backplane interface port 416a remains vacant after installation of the terminal assembly module 802.

Figure 10:
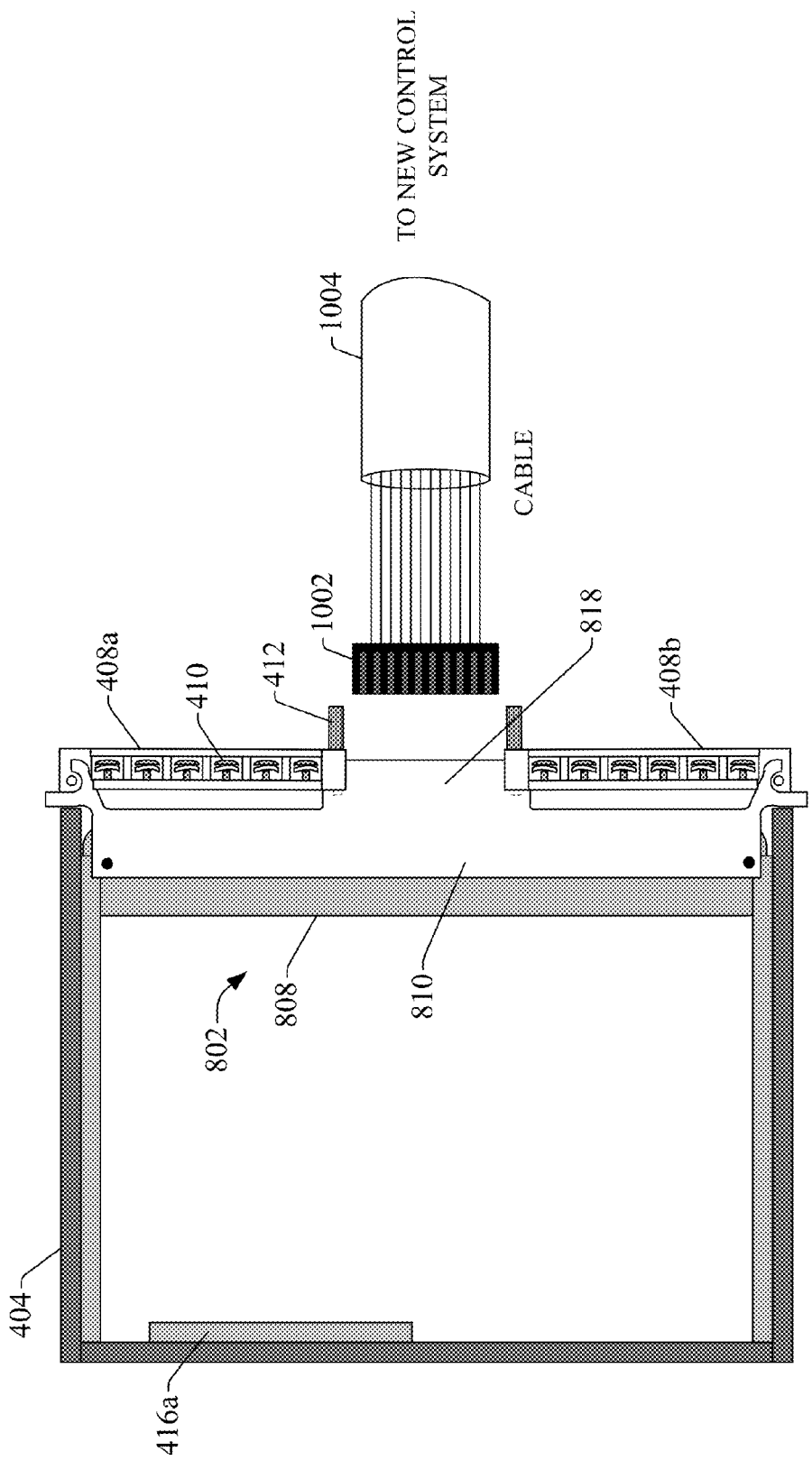
FIG. 10 is a diagram illustrating an installed terminal assembly module with both swing arms in their home positions and electrically connected to the terminal assembly module's edge connectors.

Once the terminal assembly module 802 has been installed in the chassis 404, the dowels 506 of swing arms 408 can be inserted into the hinge portions 804a and 804b of carrier 810. The swing arms 408—with their existing I/O wiring intact—can then be swung back into their home position, causing the elongated interface receptacle 508 of each swing arm to electrically connect to the corresponding edge connector 806 of terminal assembly module 802. FIG. 10 is a diagram illustrating the installed terminal assembly module 802 with both swing arms 408 in their home positions and electrically connected to the terminal assembly module's edge connectors. FIGS. 9 and 10 omit the existing wires connected to terminals 410 for clarity. Once in the home position, each swing arm 408 can be locked into position using screw 412 and screw holes 820 in the carrier 810.

When the elongated interface receptacle 508 on the rear side of each swing arm is connected to the corresponding edge connector 806 of the terminal assembly module 802, the terminals of the swing arm—and their associated I/O wiring—become electrically connected to the conductive strips of the edge connector. Consequently, each swing arm terminal becomes electrically connected to a pin of the cable connector 812 located in the cable receptacle area 818 of carrier 810 by way of the traces 814 and conductive pads 816 on the circuit board 808. Thus, by replacing the obsolete I/O module 424 with terminal assembly module 802, the I/O module terminals 410, which had previously been electrically connected to backplane interface port 416a via the I/O module circuitry, instead become electrically connected to the cable connector 812 located in the cable receptacle area 818 of terminal assembly module 802. A cable 1004 with a female cable connector 1002 can then be connected to the male cable connector 812 in the cable receptacle area 818, thereby electrically connecting the swing arm terminals 410—and their associated I/O wires—to the conductors of cable 1004.

Figure 11:
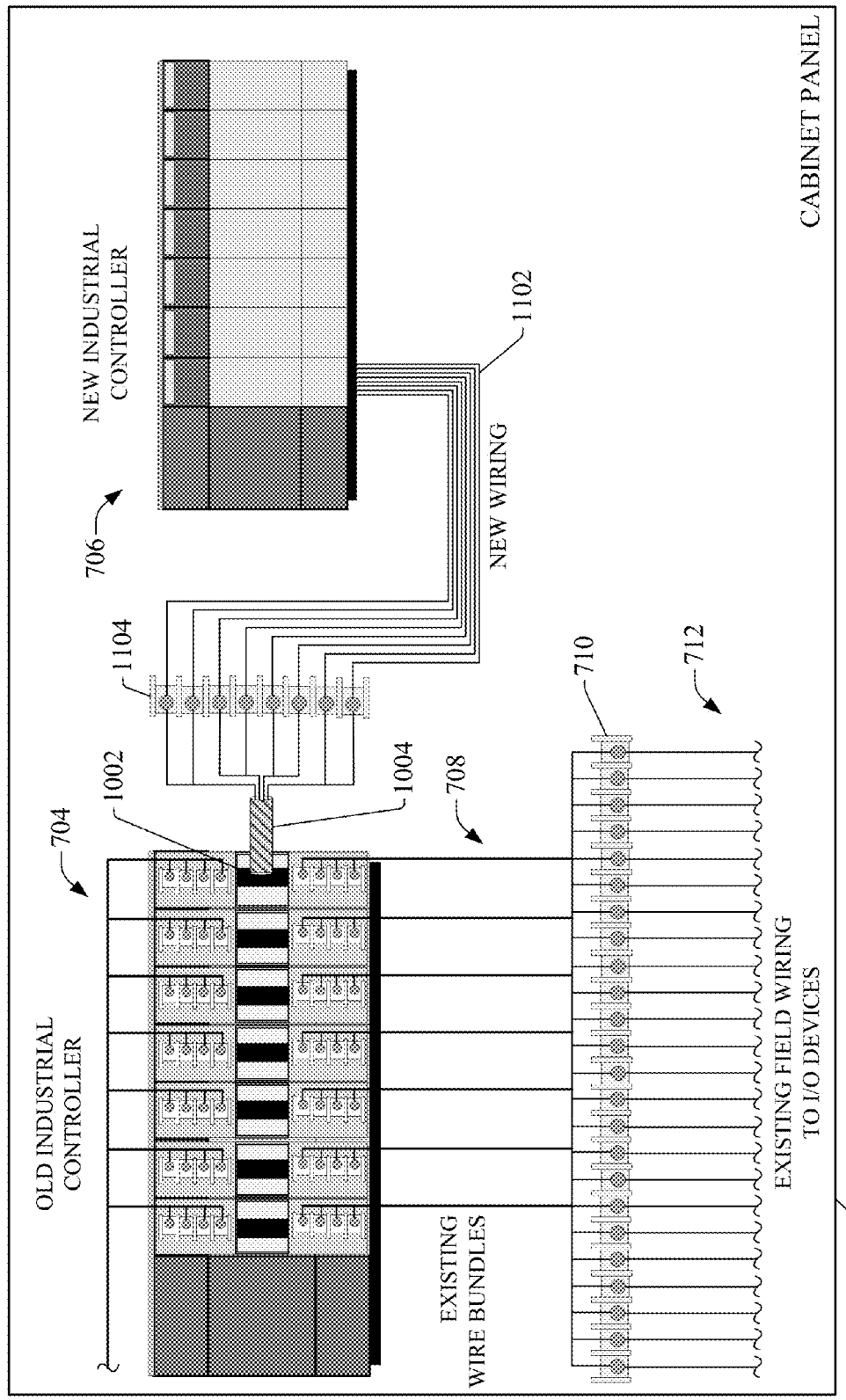
FIG. 11 is a diagram illustrating a panel layout including new electrical connections between a terminal assembly module and a new industrial controller.

With the assembly terminal module 802 in place in the chassis 404 of the old industrial controller and the multi-conductor cable 1004 plugged into the cable receptacle area 818 of the module, the cable 1004 can be routed to the replacement I/O module in the new industrial controller 706. FIG. 11 is a diagram illustrating the revised panel layout for panel 702 (see FIG. 7) including the new electrical connections between the terminal assembly module and the new industrial controller 706. In this example, all the obsolete I/O modules of old industrial controller 704 have been removed from the old chassis and replaced with terminal assembly modules. The existing wire bundles 708 connected to the terminal swing arms on the old chassis have been left intact and remain terminated on the swing arm terminals. Cable 1004 has been plugged into the cable receptacle area of the right-most terminal assembly module (the cables connected to the other terminal assembly modules are omitted from FIG. 11 for clarity). The conductors of cable 1004 have been electrically connected to the terminals of a new I/O module in the new industrial controller 706, the new I/O module now serving as a replacement for the obsolete I/O module that had previously resided in the slot now occupied by the terminal assembly module. Each conductor of cable 1004—which is electrically connected to one of the swing arm terminals on the old controller chassis by virtue of the terminal assembly module—can be electrically connected to a corresponding terminal of the replacement I/O module, either directly or via a terminal block 1104. In some scenarios, the installer may choose to install fuses or relays in series with the conductors of cable 1004.

Using this technique, the existing wire bundles 708 need not be removed or disconnected from the original I/O module terminals. If no terminal block 1104 is to be used, the I/O devices in the field can be electrically connected to the new I/O modules of new industrial controller 706 by simply terminating the new cable conductors to their respective terminals on the new I/O modules, with no other wiring necessary. This termination is only required on one end of the cable, since the other end plugs easily into the cable receptacle area of the terminal assembly module. If a terminal block 1104 is used, the only new wiring required is the termination of the cable conductors to respective terminals of terminal block 1104, and the running of new wiring 1102 from the terminal block 1104 to the new I/O module terminals.

In this example, the terminal assembly module performs no signal conditioning, but instead functions to pass signaling unaltered between the cable 1004 and existing I/O terminals of the swing arms. As such, the terminal assembly module can be used to replace both input and output modules. For example, if the terminal assembly module is replacing an obsolete input module on the old controller chassis, input signals from field devices will continue to be received at the old input terminals (now connected to the terminal assembly module) via the existing field wiring 712 and wire bundles 708. However, rather than being passed to the backplane of the old industrial controller to be sent to the old controller module, the input signals are now routed by the terminal assembly module from the old input terminals to the conductors of cable 1004, which send the input signals to the corresponding terminals of the new input module on new industrial controller 706. Similarly, if the terminal assembly module is replacing an obsolete output module of the old controller, output signals from the corresponding replacement output module of new industrial controller 706 (e.g., discrete 24 VDC signals, 4-20 ma analog signals, etc.) will be sent to the original output terminals on the old controller chassis via the new wiring 1102 (if used), cable 1004, and the traces of the terminal assembly module. Placing these output signals on the original output terminals of the old chassis ensures that the signals will be sent to the appropriate output devices via the existing wire bundles 708 and field wiring 712.

The terminal assembly module 802 illustrated in FIGS. 8A-8C is a 16-point module for replacement of a 16-point input or output module. However, terminal assembly modules of various I/O point sizes can be made available to provide suitable replacements for I/O modules of different point sizes.

Figure 12:
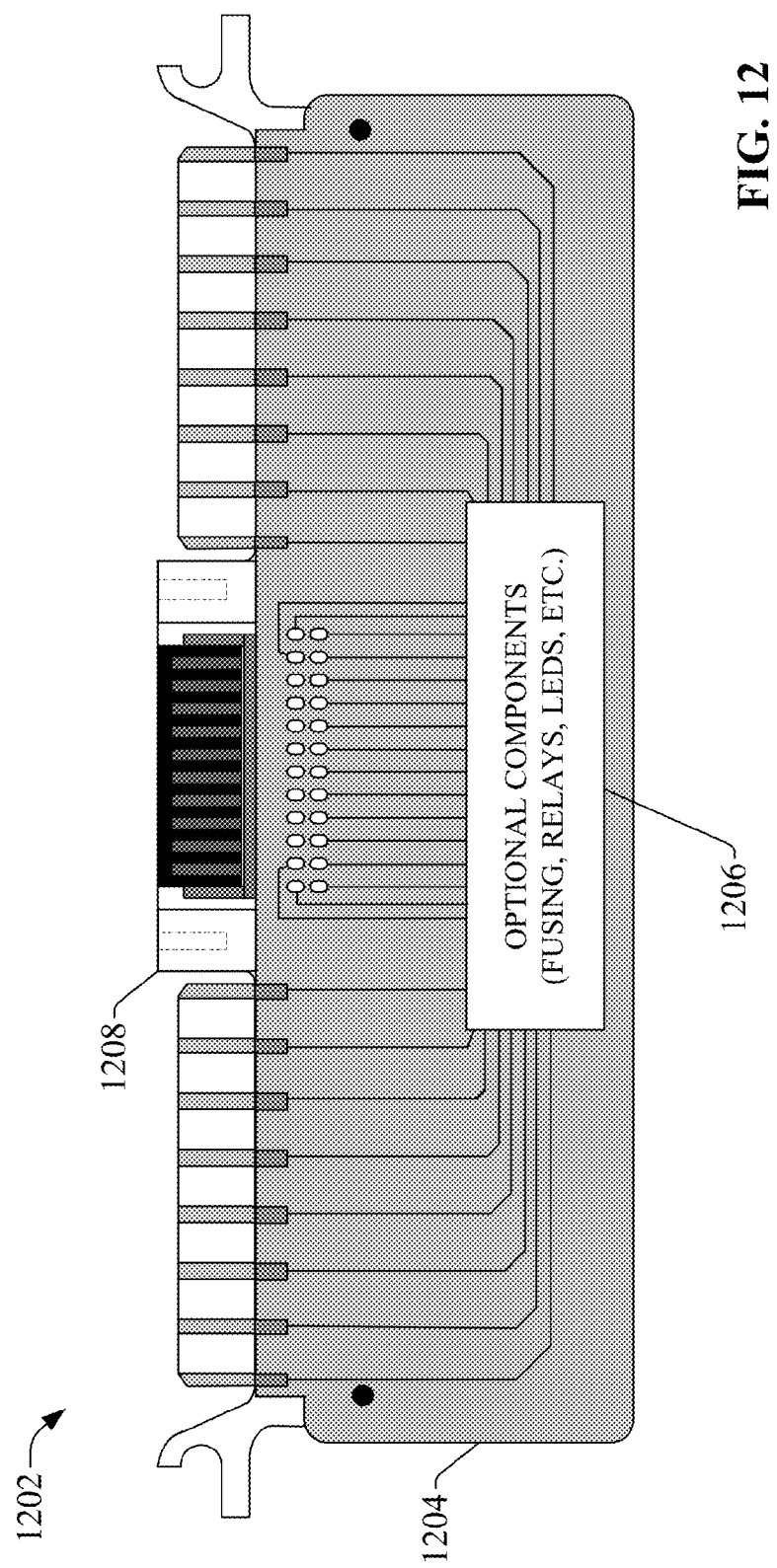
FIG. 12 is a diagram illustrating a terminal assembly module that designates a portion of the circuit board for optional components.

While the terminal assembly module has been described above as passing the I/O signaling between the cable 1004 and existing I/O terminals unaltered and without intermediate components between the conductive strips and the conductive pads, some embodiments of the terminal assembly module may include additional electrical components on the circuit board 808. FIG. 12 illustrates an alternative embodiment of the terminal assembly module 1202 that designates a portion of circuit board 1204 for optional components 1206. Optional components 1206 may comprise, for example, individual fuses or relays for each I/O signal path. Optional components 1206 may also comprise circuitry for status indicators (e.g., LEDs) that indicate respective status of the I/O signals. For example, for terminal assembly modules that convey digital I/O signals, LEDs may be installed on the outward face of the terminal assembly module (e.g., on or around the cable receptacle area or elsewhere on the carrier) to indicate an on/off status of each I/O point. Accordingly, circuitry may be included on the circuit board 1204 for detecting the presence of a digital signal on each trace, and controlling the state of the indicators based on presence or absence of the signals. Depending on the circuit board layout, it may be necessary to extend the length of circuit board 1204 in order to accommodate these additional components. In this regard, the circuit board 1204 may be lengthened as needed across various embodiments, limited only by the depth of the chassis in which the terminal assembly module will be installed.

Figure 4:
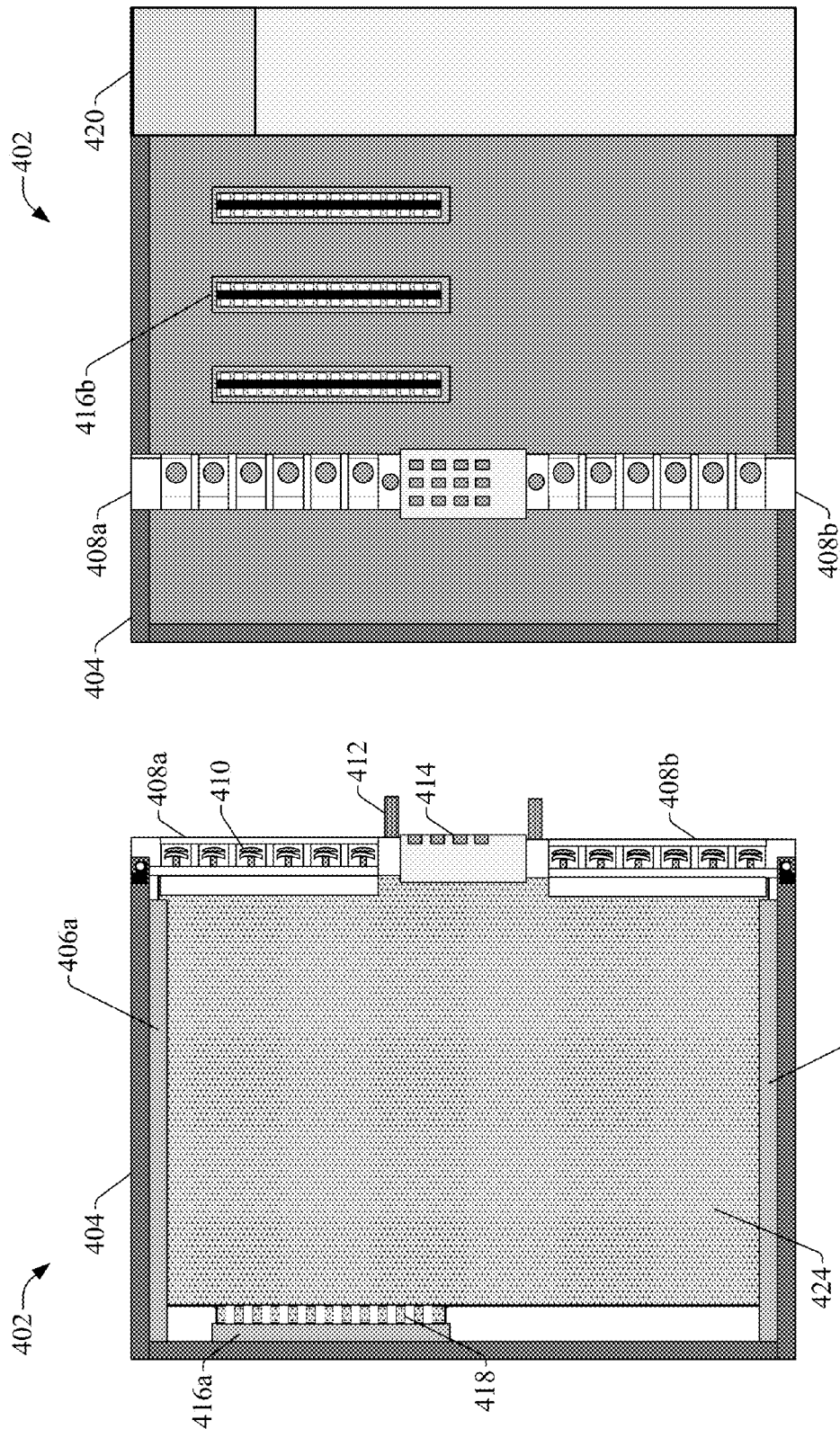
FIGS. 4A and 4B are side and front views, respectively, of an example industrial controller to be replaced with a new controller.
Figure 13:
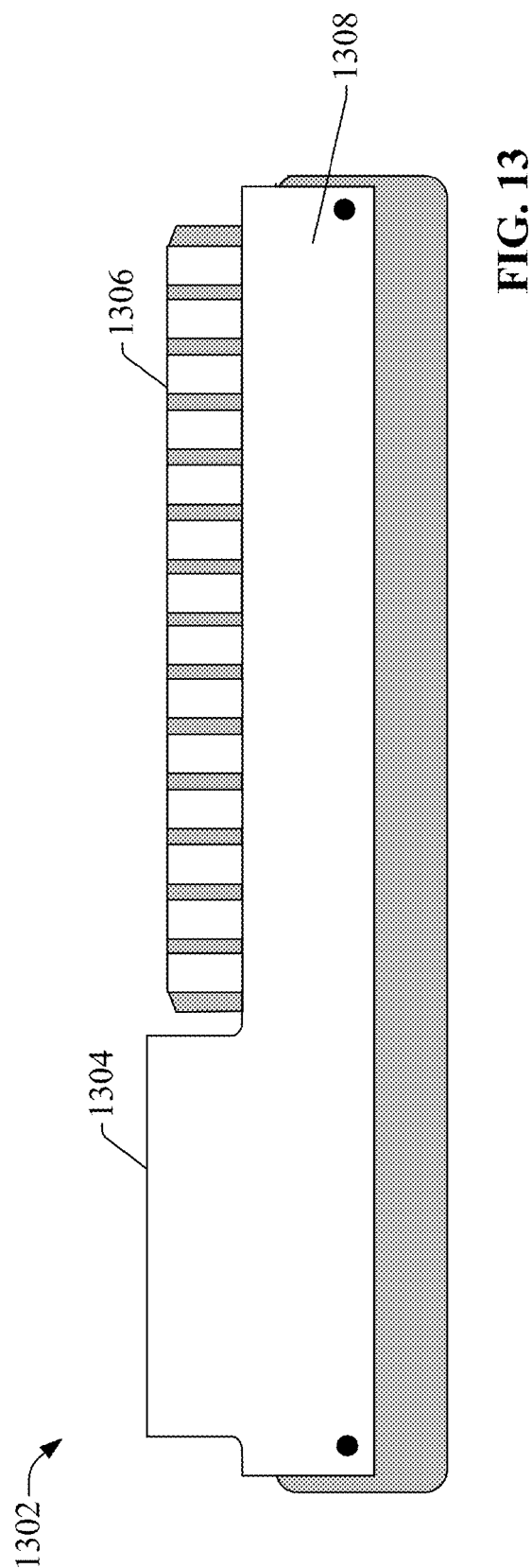
FIG. 13 is a front view of an example terminal assembly module designed for a controller chassis architecture in which all terminals for a given I/O module reside on a single removable terminal block.

Although embodiments of the terminal assembly module have been described above in the context of obsolete controllers having the example chassis and swing arm design illustrated in FIGS. 4-6, it is to be appreciated that the other embodiments of the terminal assembly module can be adapted for use with other controller chassis designs. For example, FIG. 13 is a front view of an example terminal assembly module designed for a controller chassis architecture in which all terminals for a given I/O module reside on a single removable terminal block (rather than being divided between two terminal block swing arms as in FIGS. 4-6). Accordingly, the cable receptacle area 1304 is located near one end of the carrier 1308, while a single edge connector 1306 for interfacing with the removable I/O module terminal block takes up the remaining length of the module. In this example, the I/O module terminal block does not use a dowel and hinge arrangement to swing the terminals away from the module, but rather is designed to be disconnected from the I/O module by pulling the terminal block outwardly from module. Accordingly, the carrier 1308 of this example terminal assembly module 1302 omits the hinge portions found on terminal assembly module 802. However, if the I/O module includes a doweled hinge, a single hinge portion (similar to hinge portion 804) can be located on the end of the carrier opposite the cable receptacle area 1304.

Figure 14:
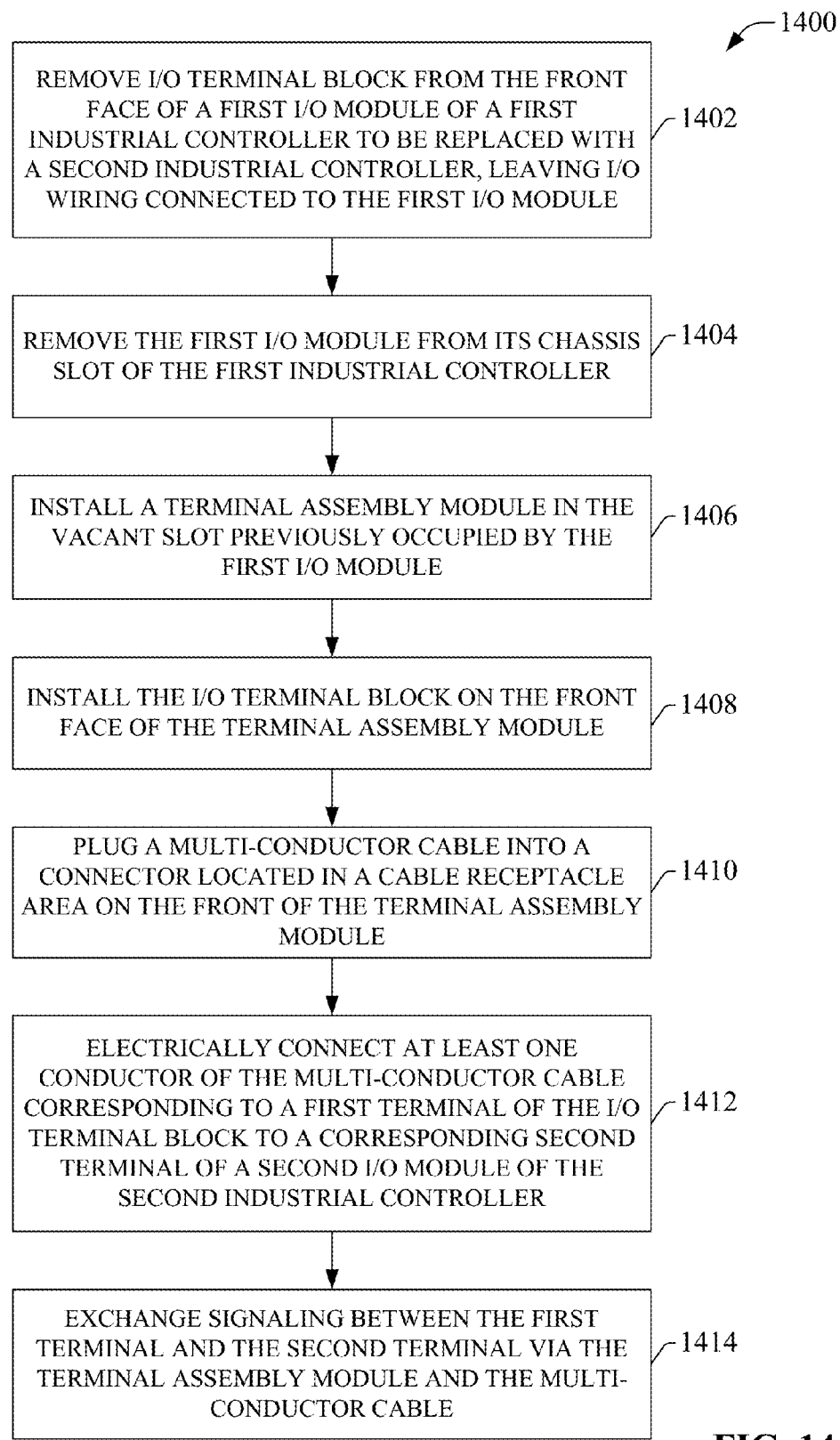
FIG. 14 is a flowchart of an example methodology for wiring an I/O module of a replacement industrial controller to existing field wiring via existing I/O module terminals of an industrial controller being replaced.
Figure 15:
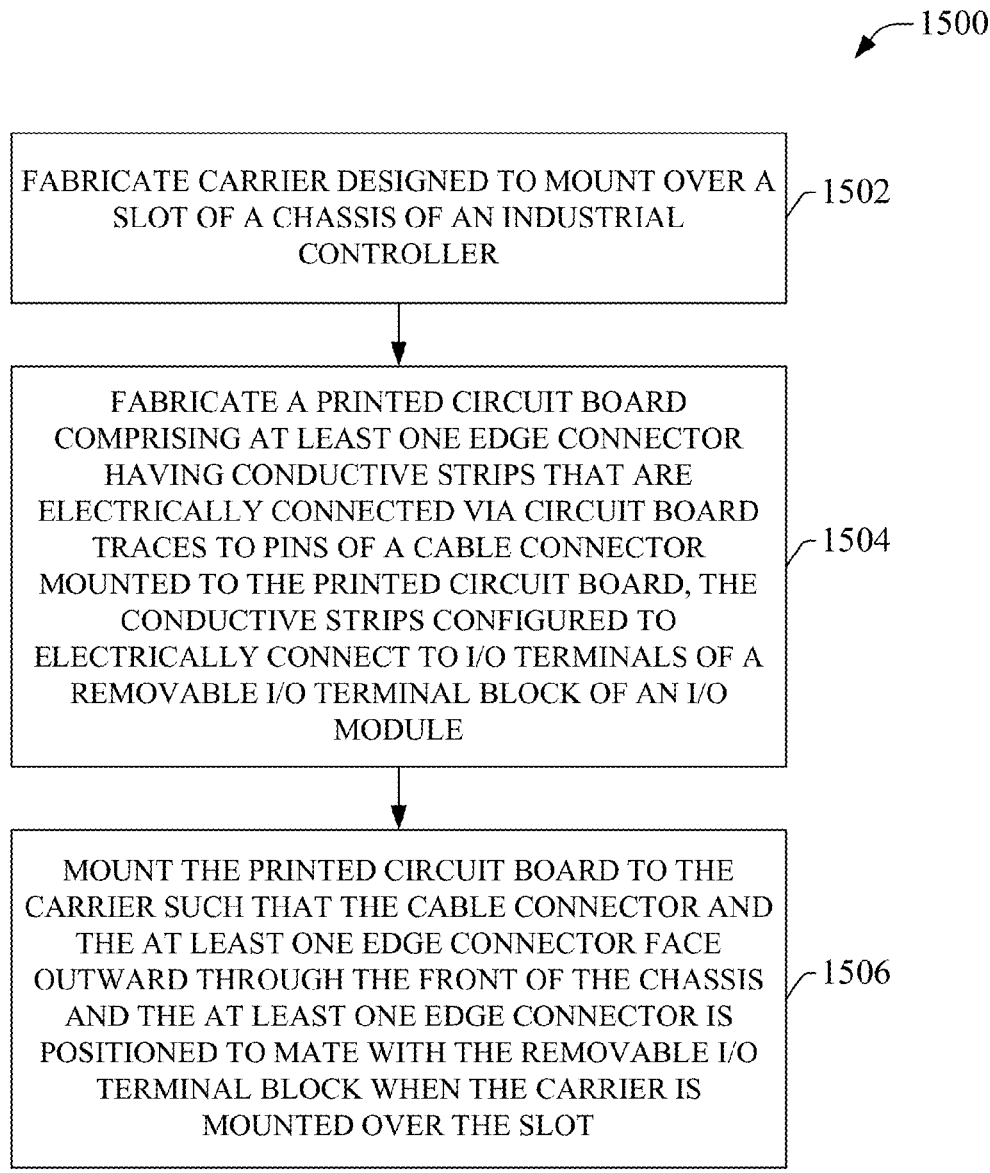
FIG. 15 is a flowchart of an example methodology for fabricating a terminal assembly module for redirecting I/O device field wiring connections from a first industrial controller to a replacement industrial controller.

FIGS. 14-15 illustrate various methodologies in accordance with one or more embodiments of the subject application. While, for purposes of simplicity of explanation, the one or more methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 14 illustrates an example methodology 1400 for wiring an I/O module of a replacement industrial controller to existing field wiring via the I/O module terminals of a pre-existing industrial controller. Initially, at 1402, an I/O terminal block is removed from the front face of a first I/O module of a first industrial controller to be replaced with a second industrial controller. The I/O wiring connected to the I/O terminal block is left intact when the I/O terminal block is removed. At 1404, the first I/O module is removed from its chassis slot of the first industrial controller.

At 1406, a terminal assembly module is installed in the vacant slot previously occupied by the first I/O module. The terminal assembly module can be selected to have s number of I/O point terminals equal to that the I/O module that previously occupied the slot. At 1408, the I/O terminal block removed at step 1402 is installed—with its I/O wiring still connected to its terminals—on the front face of the terminal assembly module. The terminal assembly module is designed to electrically connect each terminal of the I/O terminal block to a pin of a male cable connector (or a socket connector of a female cable connector) located in a cable receptacle area on the front of the terminal assembly module.

At 1410, a multi-conductor cable is plugged into the cable connector located in the cable receptacle area on the front of the terminal assembly module. Plugging the cable into this connector electrically connects each terminal of the I/O terminal block to a conductor of the cable via the terminal assembly module. At 1412, at least one conductor of the multi-conductor cable corresponding to a first terminal of the I/O terminal block is electrically connected to a corresponding second terminal of a second I/O module installed in the second industrial controller. The conductor can be connected directly to the second terminal; alternatively, the conductor can be landed on one or more intermediate terminal blocks and new wiring can be installed between the intermediate terminal blocks and the second I/O terminal Electrically connecting the cable conductor to the second terminal of the second (replacement) I/O module causes the second terminal to be electrically connected to the corresponding first terminal of the first I/O terminal block, and consequently completes the electrical path between the new I/O module terminal and the field wiring already connected to the first terminal of the first I/O terminal block.

At 1414, signaling is exchanged between the first terminal (and its associated field device) and the second terminal of the new I/O module via the terminal assembly module and the multi-conductor cable.

FIG. 15 illustrates an example methodology 1500 for fabricating a terminal assembly module configured to redirect I/O device field wiring connections from a first industrial controller to a replacement industrial controller. Initially, at 1502, a carrier is fabricated, wherein the carrier is designed to mount over a slot of a chassis of an industrial controller. At 1504, a printed circuit board is fabricated, comprising at least one edge connector having conductive strips that are electrically connected via circuit board traces to pins of a cable connector mounted to the printed circuit board. The at least one edge connector is configured to connect to an interface port on the rear of a removable I/O terminal block of an I/O module, such that the conductive strips electrically connect to I/O terminals of the removable I/O terminal block.

At 1506, the printed circuit board is mounted to the carrier such that the cable connector and the at least one edge connector face outward through the front of the chassis of the industrial controller and the at least one edge connector is positioned to mate with the removable I/O terminal block when the carrier is mounted over the slot of the chassis.

Embodiments, systems, and components described herein, as well as industrial control systems and industrial automation environments in which various aspects set forth in the subject specification can be carried out, can include computer or network components such as servers, clients, programmable logic controllers (PLCs), automation controllers, communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC, industrial controller, or automation controller as used herein can include functionality that can be shared across multiple components, systems, and/or networks. As an example, one or more PLCs, industrial controllers, or automation controllers can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC, industrial controllers, or automation controller can also communicate to and control various other devices such as standard or safety-rated I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A terminal assembly module, comprising:
    a carrier configured to mount over a slot of an industrial controller chassis; and
    a circuit board mounted to the carrier,
    wherein the circuit board comprises at least one edge connector having conductive strips that are electrically connected, via conductive traces on the printed circuit board, to respective pins of a cable connector mounted to the circuit board,
    wherein the carrier is configured to orient the at least one edge connector and the cable connector to face outward through the front of the industrial controller chassis and to align the at least one edge connector to interface with at least one I/O terminal block of an I/O module while the carrier is mounted over the slot.

2. The terminal assembly module of claim 1, wherein the conductive strips are configured to electrically connect to respective terminals of the at least one I/O terminal block while the at least one I/O terminal block is interfaced with the at least one edge connector.

3. The terminal assembly module of claim 2, further comprising a multi-conductor cable configured to plug into the cable connector, wherein conductors of the multi-conductor cable are electrically connected to the conductive strips via the conductive traces while the multi-conductor cable is plugged into the cable connector.

4. The terminal assembly module of claim 1, wherein the at least one edge connector comprises two edge connectors, and the cable connector is located between the two edge connectors.

5. The terminal assembly of claim 4, wherein the carrier comprises two hinge sections located on respective ends of the carrier, and wherein each of the two hinge sections is configured to receive a pair of dowels connected near one end of an I/O terminal block, of the at least one I/O terminal block, and to allow the I/O terminal block to swivel into position on one of the two edge connectors.

6. The terminal assembly of claim 1, wherein the cable connector is located near a first end of the carrier and the at least one edge connector is located between the cable connector and a second end of the carrier opposite the first end.

7. The terminal assembly of claim 1, wherein the conductive traces pass through at least one of respective fuses or respective relays mounted to the printed circuit board.

8. The terminal assembly of claim 1, further comprising one or more indicator lights configured to illuminate in response to detection of a signal on respective one or more of the conductive traces.

9. A system for electrically connecting an I/O module of an industrial controller to I/O device wiring, comprising:
    a circuit board comprising at least one edge connector and a cable connector, wherein the at least one edge connector comprises conductive strips that are electrically connected to respective pins of the cable connector via conductive traces on the circuit board; and
    a carrier configured to mount over a slot of an industrial controller chassis and to hold the circuit board with the at least one edge connector and the cable connector facing outward through the front of the industrial controller chassis while the carrier is mounted over the slot, wherein the carrier is configured to position the at least one edge connector within the slot to allow the at least one edge connector to connect to at least one I/O terminal block of an I/O module.

10. The system of claim 9, wherein the conductive strips are arranged on the at least one edge connector to electrically connect to respective terminals of the at least one I/O terminal block when the at least one I/O terminal block is connected to the at least one edge connector.

11. The system of claim 10, wherein the cable connector is a first connector, and the system further comprises a multi-conductor cable comprising a second connector on one end, wherein the second connector is configured to interface with the first connector, and wherein conductors of the multi-conductor cable are electrically connected to the conductive strips via the conductive traces when the first connector and the second connector are connected.

12. The system of claim 9, wherein the at least one edge connector comprises two edge connectors, and the cable connector is located between the two edge connectors.

* * * * *